(12) United States Patent
Xie

(10) Patent No.: US 10,381,464 B2
(45) Date of Patent: Aug. 13, 2019

(54) METHOD FOR MANUFACTURING SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Xinyun Xie, Shanghai (CN)

(73) Assignees: SEMICONDUCTOR MANUFACTURING INTL. (SHANGHAI) Corp., Shanghai (CN); SEMICONDUCTOR MANUFACTURING INTL. (Beijing) Corp., Beijing (CN)

( * ) Notice: Subject to any disclaimer, the term of this patent is extended or adjusted under 35 U.S.C. 154(b) by 0 days.

(21) Appl. No.: 15/973,978

(22) Filed: May 8, 2018

(65) Prior Publication Data
US 2018/0337265 A1    Nov. 22, 2018

(30) Foreign Application Priority Data
May 19, 2017   (CN) .......................... 2017 1 0357936

(51) Int. Cl.
| | | |
|---|---|---|
| H01L 21/762 | (2006.01) | |
| H01L 29/66 | (2006.01) | |
| H01L 29/78 | (2006.01) | |
| H01L 29/06 | (2006.01) | |
| H01L 29/08 | (2006.01) | |

(52) U.S. Cl.
CPC .. *H01L 29/66795* (2013.01); *H01L 21/76224* (2013.01); *H01L 29/0649* (2013.01); *H01L 29/0847* (2013.01); *H01L 29/66545* (2013.01); *H01L 29/66636* (2013.01); *H01L 29/785* (2013.01); *H01L 29/6653* (2013.01); *H01L 29/6656* (2013.01); *H01L 29/7848* (2013.01)

(58) Field of Classification Search
CPC ........................ H01L 29/66545; H01L 21/762
See application file for complete search history.

(56) References Cited

U.S. PATENT DOCUMENTS

2018/0301558 A1* 10/2018 Chiang ............... H01L 21/0206

\* cited by examiner

*Primary Examiner* — Thomas L Dickey
(74) *Attorney, Agent, or Firm* — Brinks Gilson & Lione

(57) ABSTRACT

This disclosure relates to the technical field of semiconductors, and discloses a method for manufacturing semiconductor FinFET devices. The method particularly includes pre-removal of a predetermined thickness of a first region of an isolation region on sides of a fin that is not covered by a pseudo gate such that when a layer of second region of the isolation region covered by the pseudo gate is sacrificially removed during a removal of the pseudo gate, the upper surfaces of the remaining first region and the remaining second region of the isolation region are approximately leveled. By using such a method, DC and AC performances of a resulting FinFET device is improved.

7 Claims, 15 Drawing Sheets

METHOD FOR MANUFACTURING SEMICONDUCTOR DEVICE

RELATED DISCLOSURES

The present disclosure claims priority to Chinese Patent Application No. 201710357936.3, filed on May 19, 2017, the entire disclosure of which is hereby incorporated by reference.

BACKGROUND

Technical Field

This disclosure relates to the technical field of semiconductors, and in particular, to semiconductor devices and methods for manufacturing devices.

Related Art

In a process of manufacturing a fin field effect transistor (FinFET), particular for a device including an IO (Input/Output) module/component and when removing a pseudo gate oxide at a core device region, because a portion of an isolating layer below a gate may be inadvertently/sacrificially removed, the height for a portion of a semiconductor fin that is below a gate but above the isolating layer is larger than the heights of a source region and a drain region of the semiconductor fin above the isolating layer. Therefore, a volume of an active region is relatively small, thereby reducing the AC performance of a resulting semiconductor device. At the same time, because the isolating layer around a source/drain region is above the isolating layer below the gate, DC performance is affected. As a result, impedance between a source and a drain of a PMOS device formed on such a fin structure is relatively large and the device is less responsive. Therefore, the performance of the FinFET is compromised.

Therefore, it is necessary to provide a new technical solution to improve DC and AC performances of a FinFET device.

SUMMARY

An objective of this disclosure is improving DC and AC performances of a device.

In one aspect of the present disclosure, a method for manufacturing a semiconductor device is disclosed. The method may include providing a substrate structure, wherein the substrate structure containing a substrate, a semiconductor fin on the substrate, a dielectric layer on the semiconductor fin, an isolation region at sides of the semiconductor fin, wherein an upper surface of the isolation region is lower than an upper surface of the semiconductor fin wherein the isolation region comprises a first region and a second region, and a pseudo gate covering a portion of the dielectric layer and the first region of the isolation region, wherein the second region of the isolation region is located on two sides of the pseudo gate. The method may further include removing a portion of the second region for a predetermined removal depth, so that an upper surface of the remaining second region is lower than an upper surface of the first region; growing an epitaxial source and drain on the semiconductor fin on sides of the pseudo gate; removing the pseudo gate and the dielectric layer below the pseudo gate to form a groove; and forming a gate structure in the groove.

In some implementations, the predetermined removal depth is approximately equal to the inadvertently or sacrificially removed depth of the first region when removing the pseudo gate.

In some implementations, the method further includes determining the predetermined removal depth based on computer simulation.

In some implementations, the method further includes adjusting the predetermined removal depth according to a process feedback.

In some implementations, before the growing the epitaxial source and drain, the method further includes forming a first spacer layer at a side wall of the pseudo gate and at a side wall of a portion of the first region above the remaining second region.

In some implementations, growing the epitaxial source and drain includes removing, after the first spacer layer is formed, a portion of the semiconductor fin at two sides of the pseudo gate, so as to form recesses; and epitaxially growing a semiconductor material in the recesses, so as to form raised active regions.

In some implementations, the method further includes depositing an interlayer dielectric layer after the active regions are formed, where the interlayer dielectric layer is planarized to expose the pseudo gate.

In some implementations, the gate structure includes a gate dielectric layer at a bottom portion of the groove; and a gate on the gate dielectric layer.

In some implementations, the substrate structure further includes a hard mask layer on the pseudo gate.

In another aspect of the present disclosure, a semiconductor device is disclosed. The semiconductor device may include a substrate; a semiconductor fin on the substrate; an isolation region at sides of the semiconductor fin, wherein an upper surface of the isolation region is lower than an upper surface of the semiconductor fin wherein the isolation region comprises a first region and a second region; and a gate structure covering a portion of the semiconductor fin and the first region of the isolation region, wherein the second region of the isolation region is located at at least one of two sides of the gate structure, and wherein an upper surface of the first region is approximately leveled with an upper surface of the second region.

In some implementations, the semiconductor device further includes a first spacer layer located at a side wall of the gate structure and at a side wall of a portion of the first region above the second region.

In some implementations, material for the first spacer layer includes a nitride of silicon.

In some implementations, thickness of the first spacer layer is 2-5 nm.

In some implementations, the semiconductor device further includes: active regions that are at the two sides of the gate structure and that are at least partially located in the semiconductor fin.

The exemplary implementations of this disclosure are described in detail below with reference to the accompanying drawings.

BRIEF DESCRIPTION OF THE DRAWINGS

The accompanying drawings which constitute a part of the specification illustrate exemplary implementations of this disclosure and, together with the specification, serve to describe the principles of this disclosure. In the accompanying drawings.

DETAILED DESCRIPTION

Exemplary implementations of this disclosure are described in detail with reference to the accompanying drawings. It should be understood that unless otherwise specified, relative layouts, mathematical expressions, and numeric values of components and steps described in these implementations should not be understood as a limitation to the scope of this disclosure.

In addition, it should be understood that for ease of description, sizes of the components shown in the accompanying drawings are not necessarily drawn according to an actual proportional relationship. For example, thicknesses or widths of some layers may be magnified with respect to other layers.

The following description of the exemplary implementations is only illustrative, and would not be regarded as any limitation on this disclosure, and on applications or uses of this disclosure in any manner.

Technologies, methods, and devices that are known by a person of ordinary skill in the relate fields may not be discussed in detail. However, in cases in which the technologies, methods, and devices are applicable, the technologies, methods, and devices should be considered as a part of the specification.

It should be noted that similar reference signs, labels, and letters represent similar items in the following accompanying drawings. Therefore, once an item is defined or described in a figure, the item does not need to be further discussed in the description of the subsequent figures.

In FinFET semiconductor device processing, when a pseudo gate is removed to form a groove for forming a real gate, a portion of an isolation region below the pseudo gate may be, e.g., inadvertently/sacrificially removed. As a result, an upper surface of the isolation region below the pseudo gate is lower than a lowest portion of a spacer layer that is at two sides of the pseudo gate. As a result, the height or thickness of a portion of a semiconductor fin below a gate but above the isolating layer is larger than the heights of a source region and a drain region of the semiconductor fin above the isolating layer. Therefore, a volume of an active region on the fin is relatively small, thereby reducing the DC and AC performances of a semiconductor device.

Figure 1:
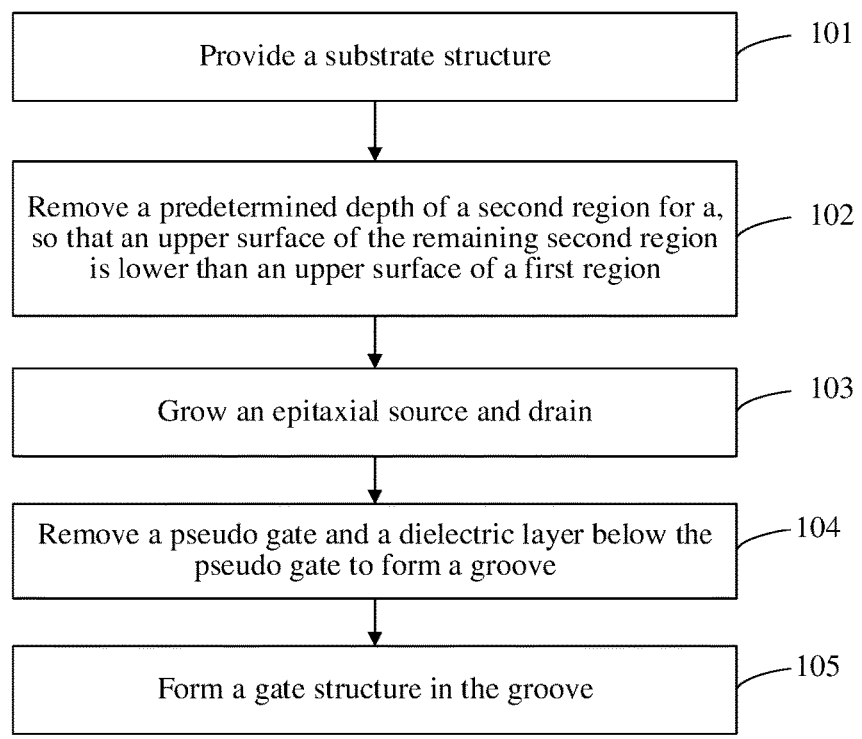
FIG. 1 is a simplified flowchart of a method for manufacturing a semiconductor device.

FIG. 1 is a simplified flowchart of a method for manufacturing a semiconductor FinFET device.

Step 101: provide a substrate structure. The substrate structure may include: a substrate; a semiconductor fin on the substrate; a dielectric layer on a surface of the semiconductor fin; an isolation region at a side of the semiconductor fin, where an upper surface of the isolation region is lower than an upper surface of the semiconductor fin; and a pseudo gate on a portion of the dielectric layer and a portion of the isolation region. Herein, the portion of the isolation region that is covered by the pseudo gate is referred to as a first region, and a portion of the isolation region that is located at at least one of two sides of the pseudo gate and not covered by the pseudo gate is referred to as a second region.

Step 102: remove a portion of a second region for a predetermined removal depth so that an upper surface of the remaining second region is lower than an upper surface of the first region. In one implementation, the predetermined removal depth may be approximately equal to a depth the first region that may be inadvertently/sacrificially removed when removing the pseudo gate, so as to ensure that the upper surfaces of the first region and the second region are approximately leveled after the removal of the pseudo gate. In one implementation, the predetermined removal depth may be determined according to experience or a computer simulation. In another implementation, the predetermined removal depth may be adjusted according to other specific effects or process feedback, so as to enable the upper surfaces of the first region and the second region to be approximately leveled after the pseudo gate is removed. The term "approximately equal to" or "are approximately leveled" in describing depth, height, and levels may refer to the that two heights, depth, or levels are within a difference between one to several nanometers, or between one nanometer and microns, or between sub-nanometer and microns.

Step 103: grow an epitaxial source and drain to increase a volume of an active region.

Step 104: remove the pseudo gate and the dielectric layer below the pseudo gate to form a groove.

Step 105: form a gate structure in the groove.

In implementations of the foregoing manufacturing method, a portion of the second region of the isolation region is removed before the pseudo gate is removed, so that an upper surface of the remaining second region is lower than the upper surface of the first region. When some depth of the first region of the isolation region under the pseudo gate is inadvertently/sacrificially removed when removing the pseudo gate, the upper surfaces of the first region and the second region may be approximately leveled again, so as to prevent the height of a portion of the semiconductor fin below the gate but above the isolating layer from being larger than the heights of the source and the drain region of the semiconductor fin above the isolating layer. Therefore, the volume of an active region is increased, thereby improving DC and AC performances of a resulting semiconductor FinFET device.

Figure 2:
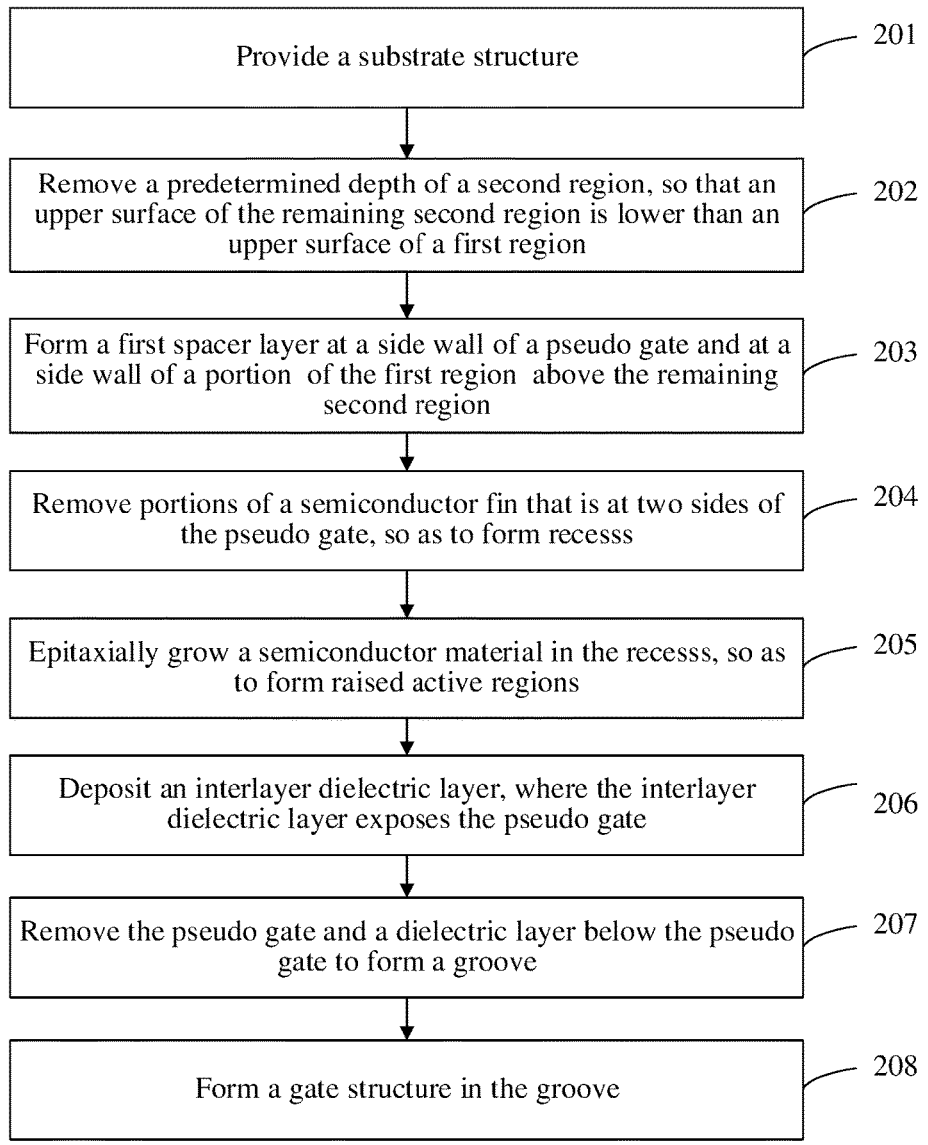
FIG. 2 is a simplified flowchart of another implementation of a method for manufacturing a semiconductor device.

FIG. 2 is a simplified flowchart of another method for manufacturing a semiconductor device.

Step 201: provide a substrate structure.

Step 202: remove a portion of a second region for a predetermined removal depth, so that an upper surface of the remaining second region is lower than an upper surface of a first region. In an implementation, the predetermined removal depth is equal to the inadvertently or sacrificially removed depth of the first region when the pseudo gate is removed, so as to ensure that the upper surfaces of the first region and the second region are approximately leveled after the pseudo gate is removed.

Step 203: form a first spacer layer at a side wall of a pseudo gate and at a side wall of a portion of the first region above the remaining second region.

Step 204: remove portions of a semiconductor fin that is at two sides of the pseudo gate, so as to form recesses.

Step 205: epitaxially grow a semiconductor material in the recesses, so as to form raised active regions.

Step 206: deposit an interlayer dielectric layer after the active regions are formed, where the interlayer dielectric layer exposes the pseudo gate.

Step 207: remove the pseudo gate and a dielectric layer below the pseudo gate to form a groove. During this process, a depth of the first region may be inadvertently or sacrificially removed, and the removed depth of the first region may be proximately equal to the predetermined removal depth of the second region.

Step 208: form a gate structure in the groove.

According to the foregoing manufacturing method, a depth of the second region is removed before an epitaxial source and drain are grown, so that the upper surface of the remaining second region is lower than the upper surface of a first region. When a pseudo gate is later removed, a inadvertent or sacrificial removal of a predetermined depth of the first region enables the upper surfaces of the first region and the second region to be approximately leveled again following the removal of the pseudo gate, so as to prevent the height of the portion of a semiconductor fin below the gate but above the isolating layer from being larger than the heights of the source and the drain region of the semiconductor fin above the isolating layer. Therefore, a volume of the active region is increased, thereby improving DC and AC performances of the resulting semiconductor device.

A method for manufacturing a semiconductor device according to some implementations of this disclosure is described in detail below with reference to FIG. 3 and FIG. 4A to FIG. 10C. It should be understood that although the steps below are described in a process flow order, some steps may merely be optional.

Figure 3:
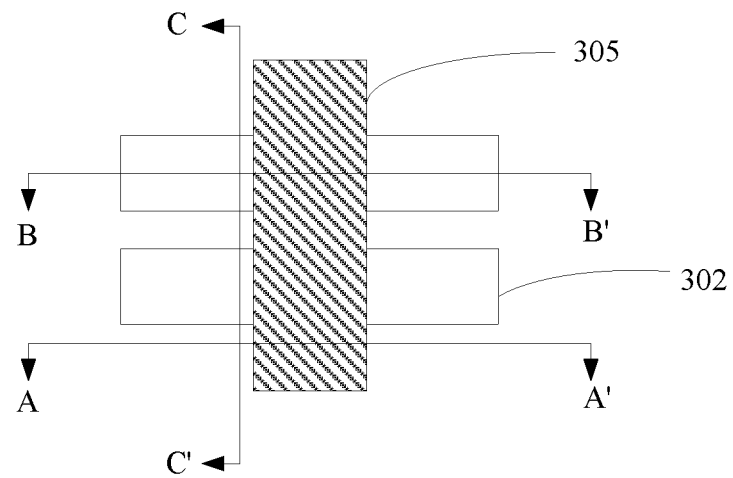
FIG. 3 shows a top view of a substrate structure.

FIG. 3 shows a top view of a substrate structure. FIGS. 4A, 5A, 6A, 7A, 8A, 9A and 10A are cross-sectional views along line A-A' shown in FIG. 3 during various processing stages. FIGS. 4B, 5B, 6B, 7B, 8B, 9B and 10B are cross-sectional views along line B-B' shown in FIG. 2 during various processing stages. FIGS. 4C, 5C, 6C, 7C, 8C, 9C and 10C are cross-sectional views along line C-C' shown in FIG. 2 during various processing stages.

Figure 4A:
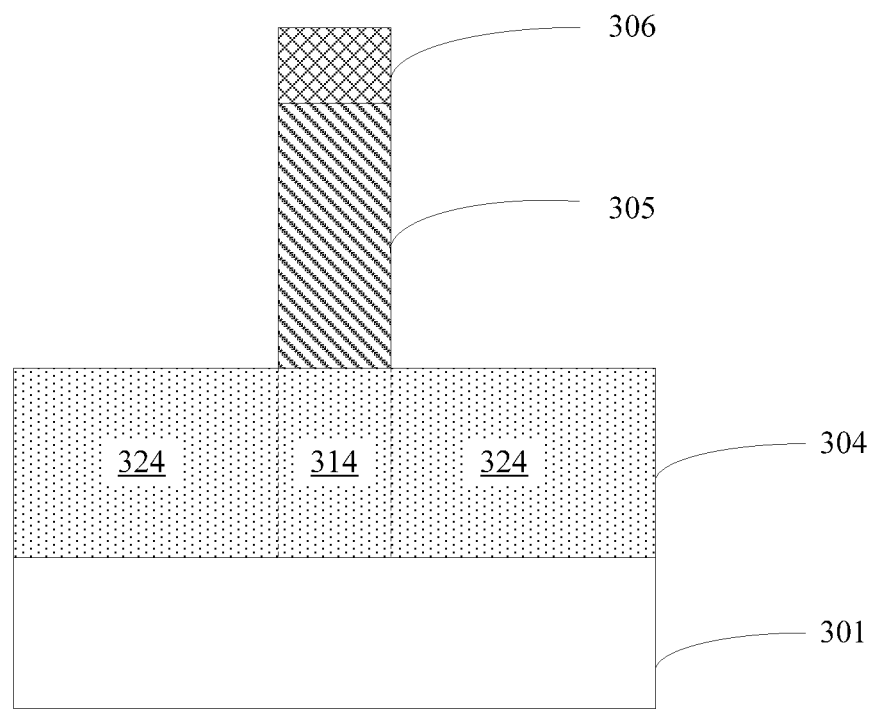
FIG. 4A to FIG. 10C show cross-sectional views at various phases of a method for manufacturing a semiconductor device.
Figure 4B:
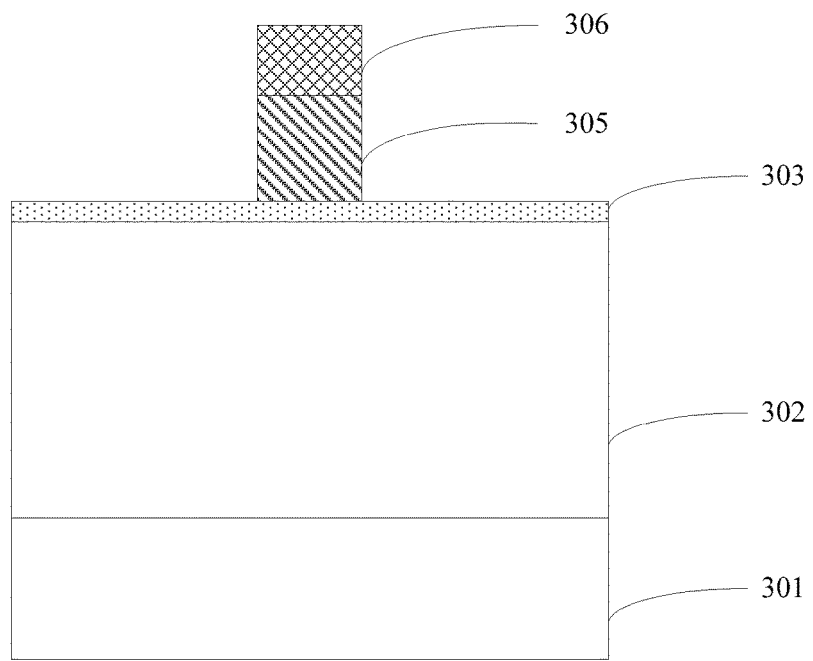
Figure 4C:
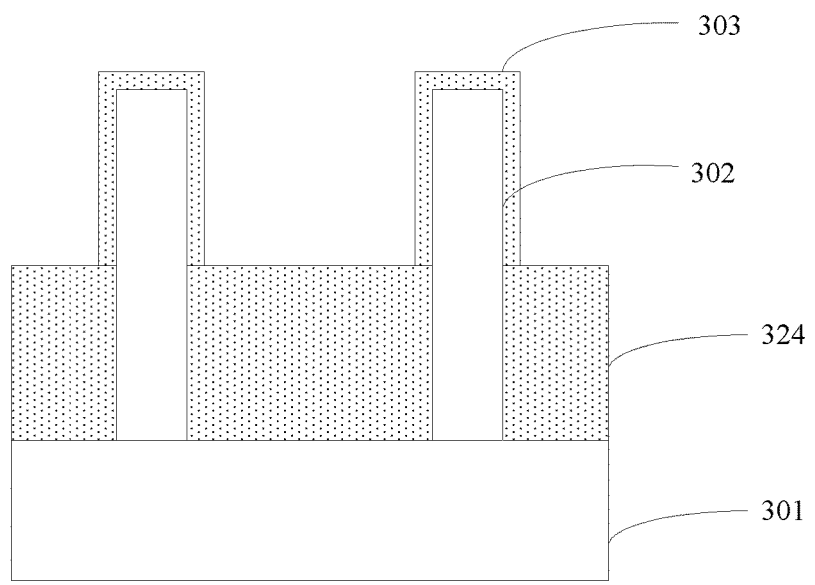

First, with reference to FIG. 4A, FIG. 4B, and FIG. 4C, a substrate structure is provided. The substrate structure may include a substrate 301; a semiconductor fin 302 on the substrate 301; and a dielectric layer 303 on the semiconductor fin 302.

The substrate 301 may be a semiconductor substrate made of an element such silicon or germanium, or may be a semiconductor substrate made of a compound such as gallium arsenide. The material for the semiconductor fin 302 may be a semiconductor material that is the same to the material of the substrate 301, or may be a semiconductor material that is different from the material of the substrate 301. The dielectric layer 303 may be an oxide of silicon, for example, silicon dioxide.

The substrate structure may further include an isolation region 304 at a side surface of the semiconductor fin 302, and a pseudo gate 305 on a portion of the dielectric layer 303 and a portion of the isolation region 304. A hard mask layer 306 may be disposed on the pseudo gate 305.

Referring to FIG. 4A, the portion of the isolation region 304 that is covered by the pseudo gate 305 is referred to as a first region 314, and a portion of the isolation region 304 that is located at at least one of two sides of the pseudo gate 305 is referred to as a second region 324. Herein, the second region 324 may be a portion of the isolation region 304 that is located at one of the two sides of the pseudo gate 305, or may be a portion of the isolation region 304 that is located at two sides of the pseudo gate 305. FIG. 4A shows the implementation where the second region 324 is located at two sides of the pseudo gate 305.

Referring to FIG. 4C, an upper surface of the isolation region 304 (the second region 324 is shown herein) is lower than an upper surface of the semiconductor fin 302.

Figure 5A:
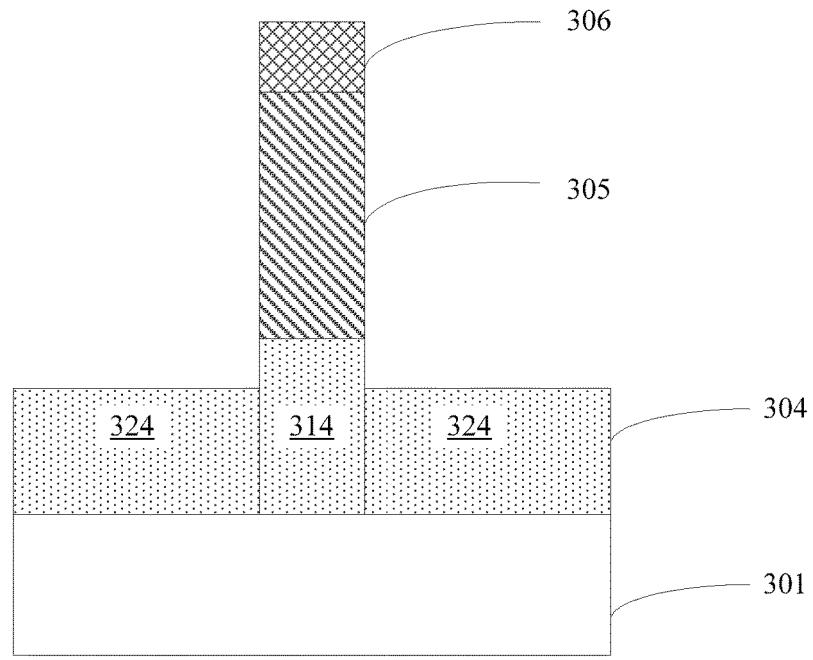
Figure 5B:
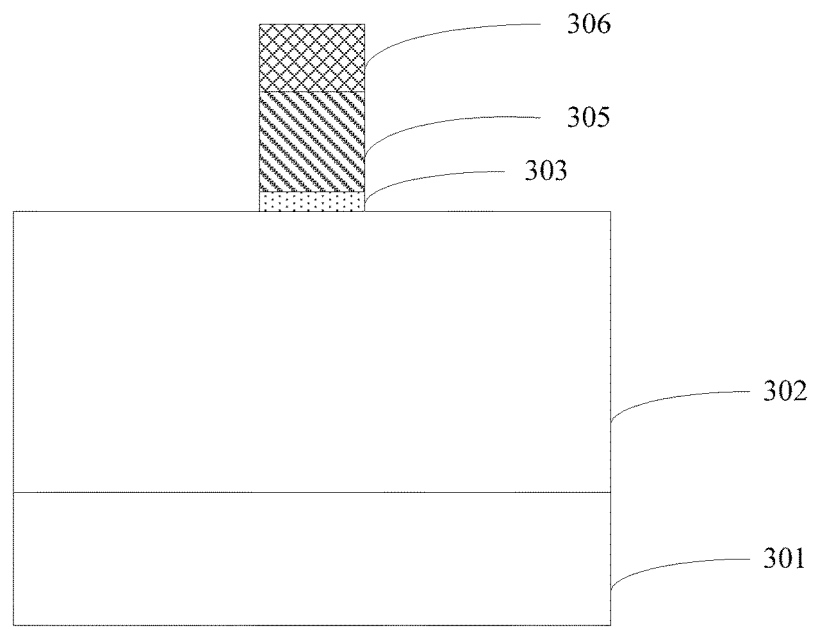
Figure 5C:
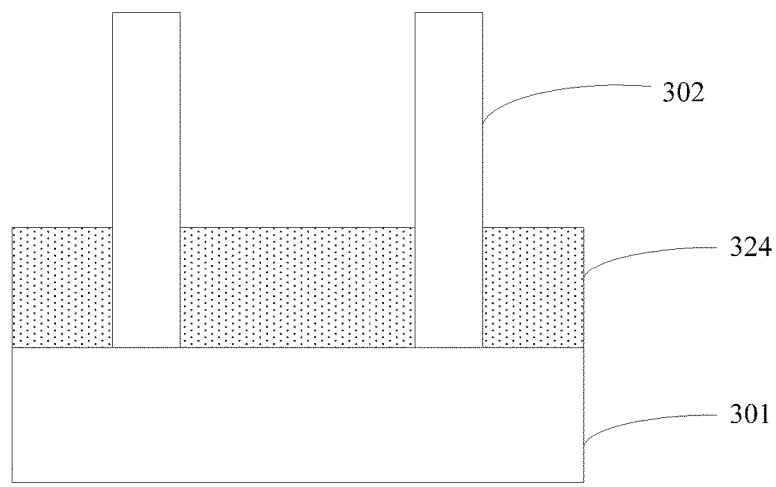

Subsequently, as shown in FIG. 5A, FIG. 5B, and FIG. 5C, a portion of the second region 324 is removed, so that an upper surface of the remaining second region 324 is lower than an upper surface of the first region 314. This step enables the upper surface of the remaining second region 324 to be away from the upper surface of the first region 314 for a distance, and the distance is approximately equal to an inadvertently or sacrificially removed depth of the first region 314 below the pseudo gate when the pseudo gate is removed subsequently (in a later step below).

Figure 6A:
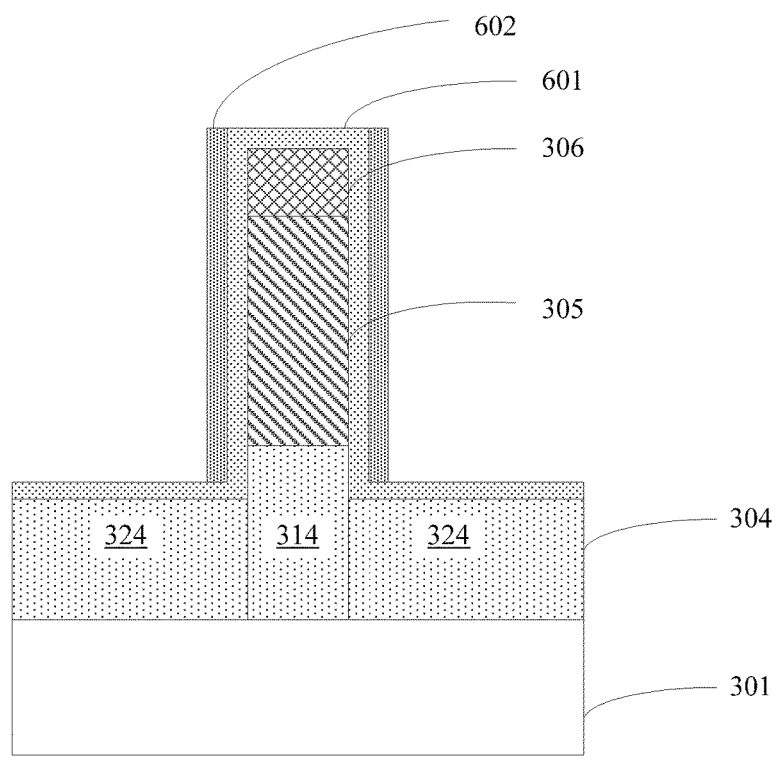
Figure 6B:
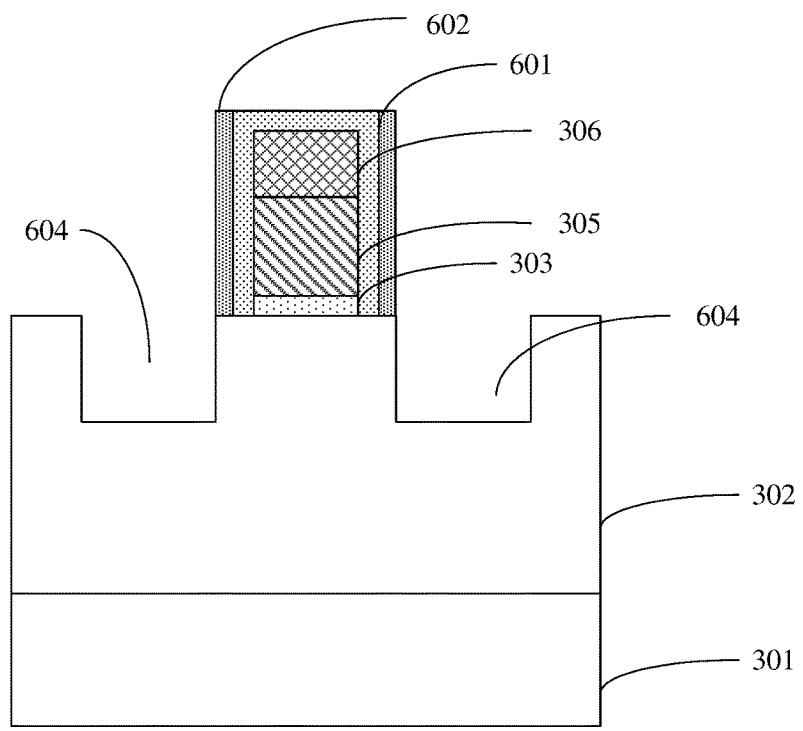
Figure 6C:
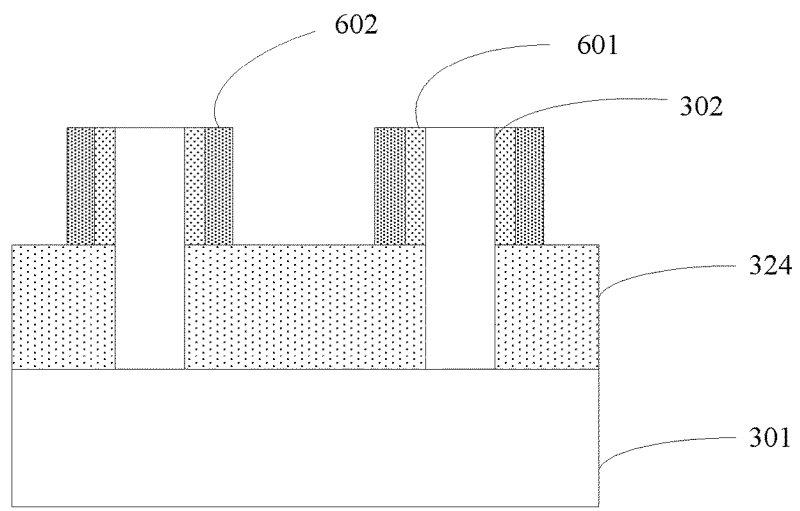

Subsequently, in one implementation as shown in FIGS. 6A-6C, a first spacer layer 602 may be deposited on a structure of FIG. 5A, FIG. 5B, and FIG. 5C. Preferably, a second spacer layer 601 is first deposited before the first spacer layer 602 is deposited. In one implementation, the material for the first spacer layer 602 may include but is not limited to a nitride of silicon, and the material for the second spacer layer 601 may include but is not limited to an oxide of silicon. For example, the first spacer layer 602 and the second spacer layer 601 may be formed using atomic layer deposition. The thickness of the first spacer layer 602 may be approximately 2-5 nm, for example, 2 nm, 3 nm, or 5 nm. The thickness of the second spacer layer 601 may be approximately 2-5 nm, for example, 2 nm, 3 nm, or 5 nm.

Subsequently, as shown in FIG. 6A, FIG. 6B, and FIG. 6C, the first spacer layer 602 is selectively etched, such that only the first spacer layer 602 that is at a side wall of the pseudo gate 305 and at a side wall of a portion of the first region 314 that is above the remaining second region 324. Therefore, the first spacer layer 602 is formed at the side wall of the pseudo gate 305 and at the side wall of the portion of the first region 314 that is above the remaining second region 324.

Subsequently, and preferably, light drain doping (LDD) may be performed at a portion of the semiconductor fin 302 at both sides of the pseudo gate 305.

Subsequently, referring to FIG. 6B and FIG. 6C, after the first spacer layer 602 is formed, the portion of the semiconductor fin 302 that is at both sides of the pseudo gate 305 may be removed, so as to form recesses 604.

Figure 7A:
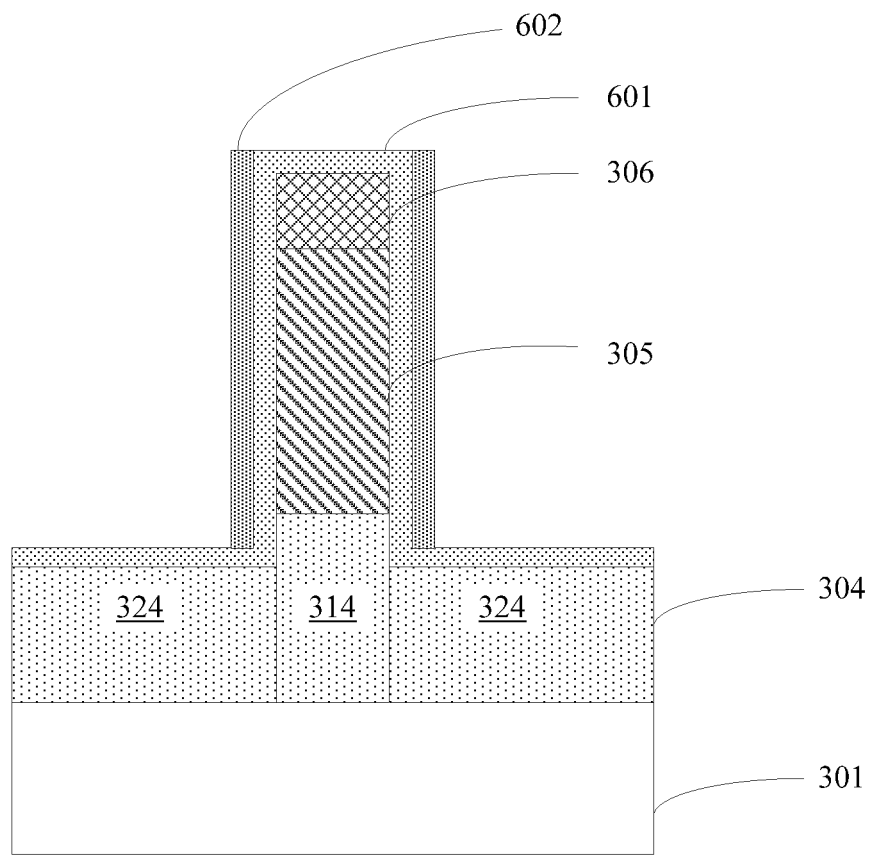
Figure 7B:
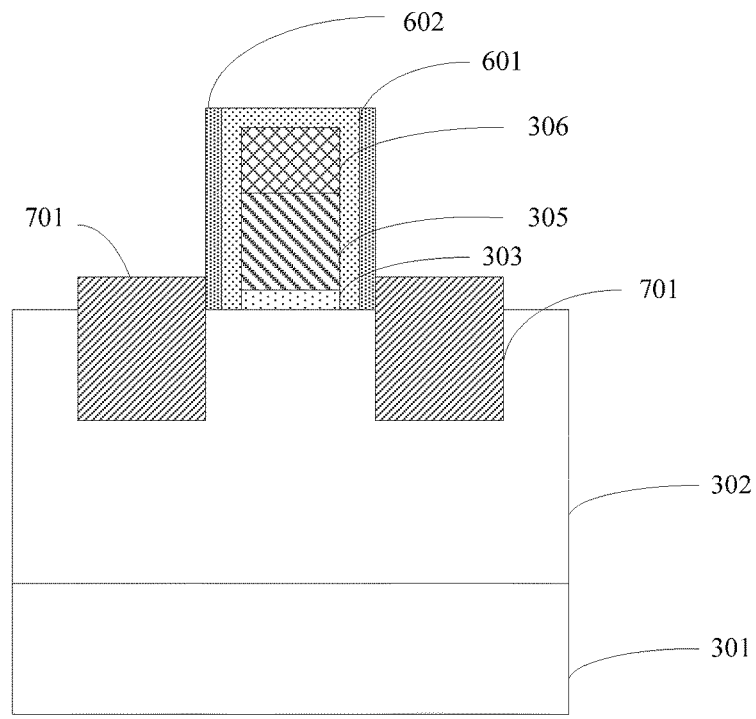
Figure 7C:
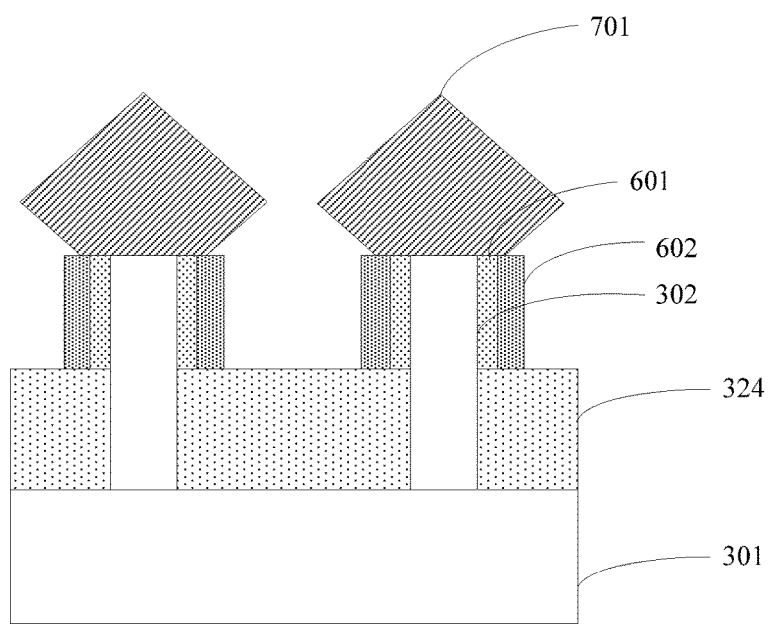

Subsequently, as shown in FIG. 7A, FIG. 7B, and FIG. 7C, a semiconductor material may be epitaxially grown in the recess 601, so as to form raised active regions 701. Herein, the raised active regions 701 include a raised source region or drain region.

It should be noted that the semiconductor fin 302 on the substrate 301 may include a semiconductor fin for forming an NMOS device and/or a semiconductor fin for forming a PMOS device. For example, some raised active regions 701 may be formed for obtaining NMOS devices and some other raised active regions 701 may be formed for obtaining PMOS devices.

For example, a portion of one semiconductor fin that is at both sides of the one pseudo gate 305 for forming an NMOS device may be removed first, so as to form one set of recesses 601; and then one semiconductor material, such as Si, is epitaxially grown in these recesses 601, so as to form one set of raised active regions 701 for forming the NMOS device. Subsequently, a portion of another semiconductor fin that is at both sides of another pseudo gate 305 for forming a PMOS device may be removed, so as to form another set of recesses 601; and then another semiconductor material, such as SiGe, is epitaxially grown in theses recesses 601, so as to form another set of raised active regions 701 for forming the PMOS device. Alternatively, the raised active regions 701 for forming the PMOS device may be first deposited, and the raised active regions 701 for forming the NMOS device may be subsequently deposited.

Figure 8A:
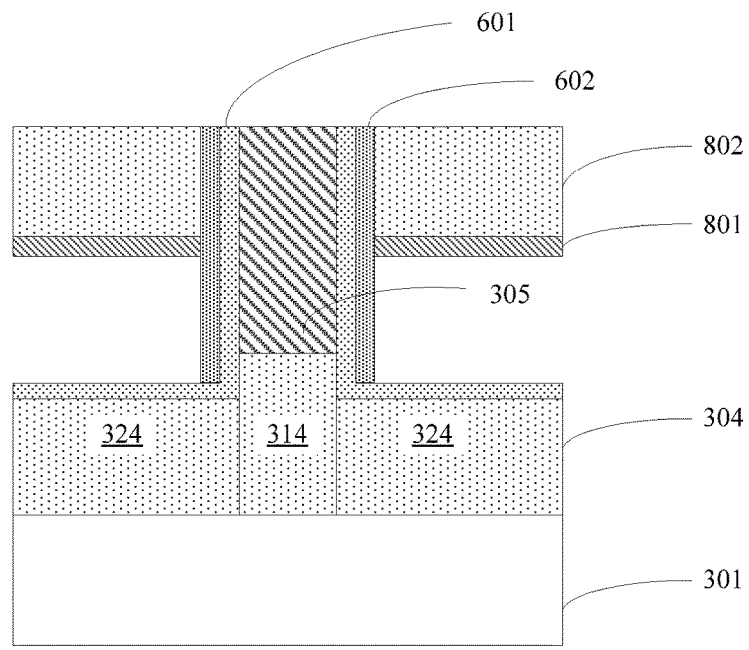
Figure 8B:
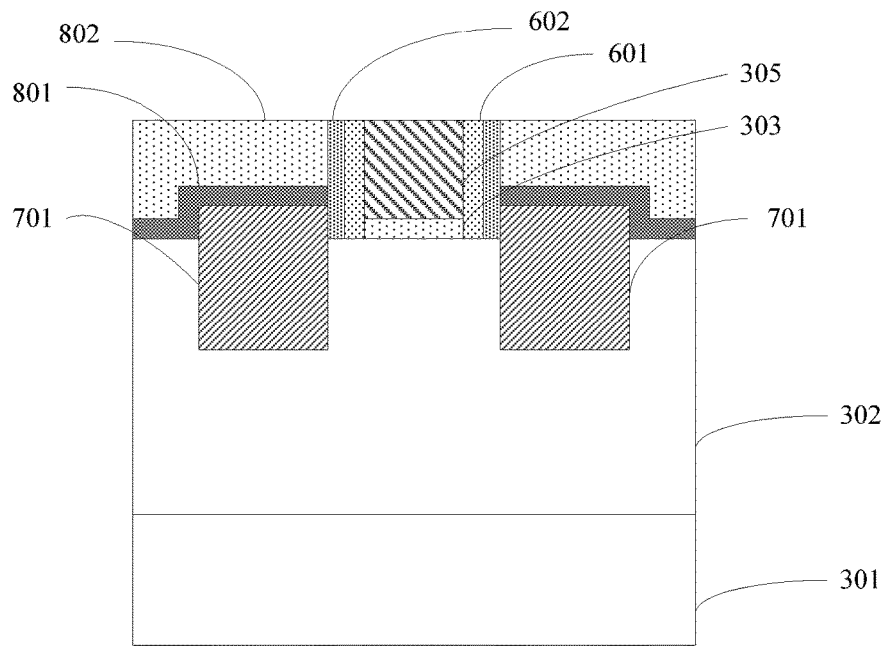
Figure 8C:
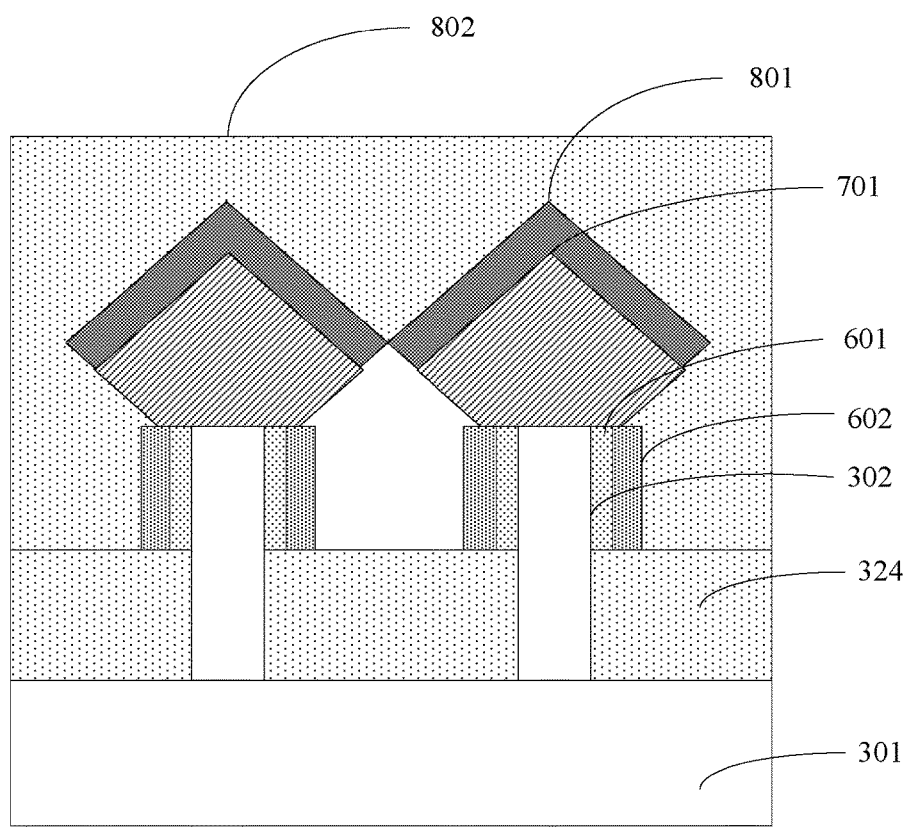

Subsequently, as shown in FIG. 8A, FIG. 8B, and FIG. 8C, an interlayer dielectric layer 802 is formed, where the interlayer dielectric layer 802 exposes the pseudo gate 305. For example, the interlayer dielectric layer 802 may be first deposited, and then the deposited interlayer dielectric layer 802 may be planarized, so as to expose the pseudo gate 305. Preferably, before the interlayer dielectric layer 802 is formed, a contact etch stop layer (CESL) 801 may further be formed on the active regions 701. It should be noted that when the pseudo gate 305 is provided with a hard mask layer 306, the planarization process may further be used to remove the hard mask layer 306.

Figure 9A:
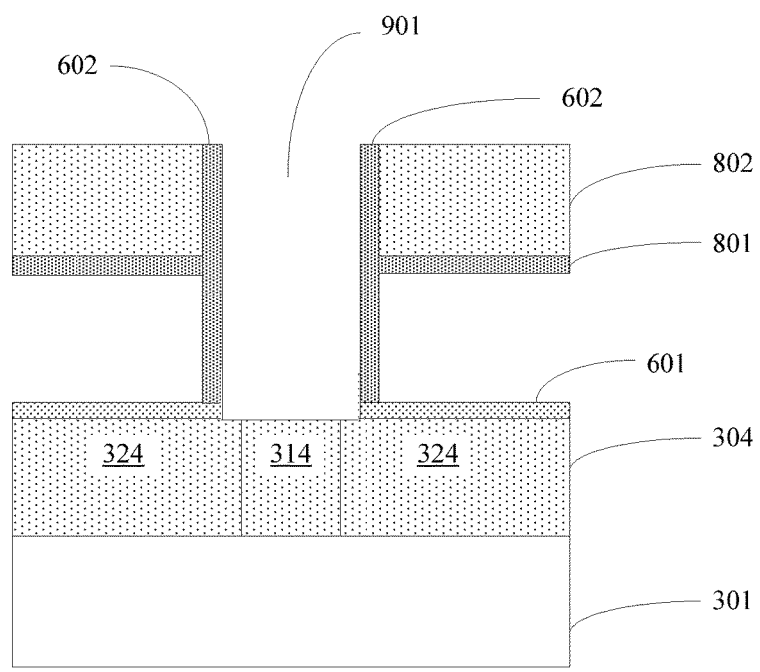
Figure 9B:
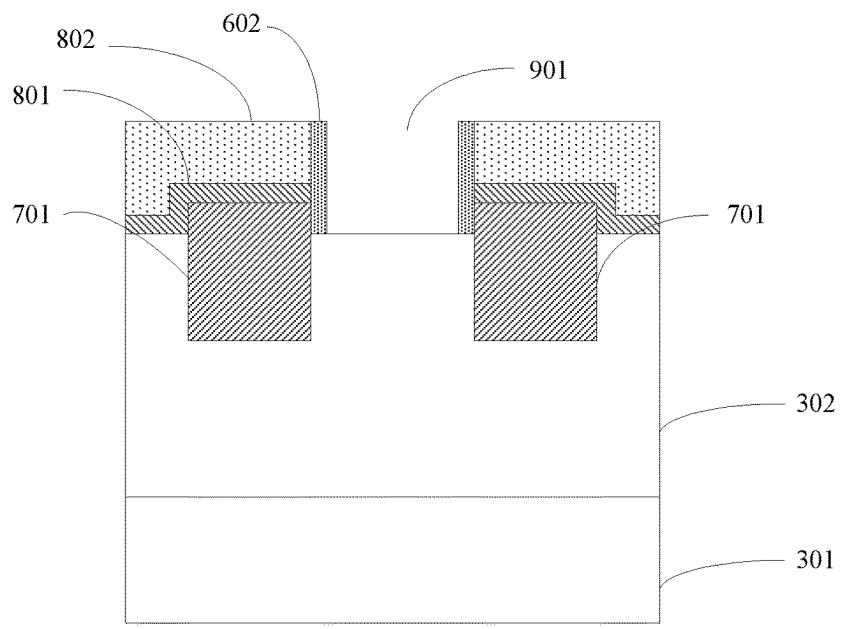
Figure 9C:
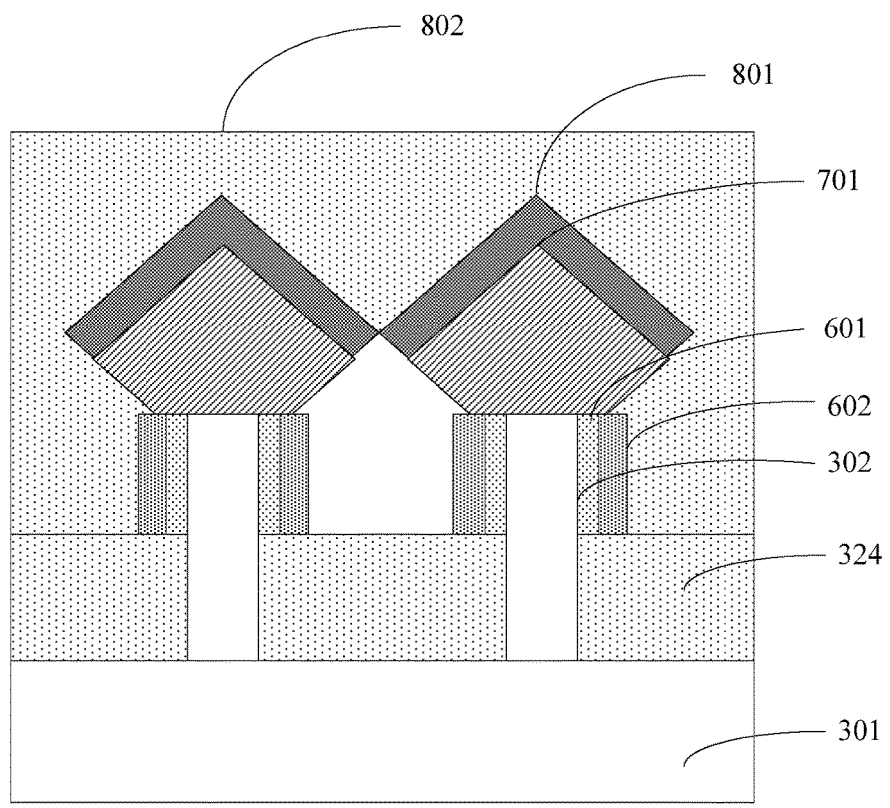

Subsequently, as shown in FIG. 9A, FIG. 9B, and FIG. 9C, the pseudo gate 305 and the dielectric layer 303 below the pseudo gate 305 are removed to form a groove 901. When removing the pseudo gate 305, a depth of the first region 314 below the pseudo gate 305 may also be inadvertently or sacrificially removed, and the removed depth of the first region 314 may be approximately equal to the depth of the second region 324 that was removed before the active regions are epitaxially grown. Therefore, as shown in FIG. 9A, the upper surfaces of the first region 314 and the second region 324 are proximately leveled. In addition, when the second spacer layer 601 is formed, the second spacer layer 601 at both sides of the pseudo gate 305 may also be removed.

Figure 10A:
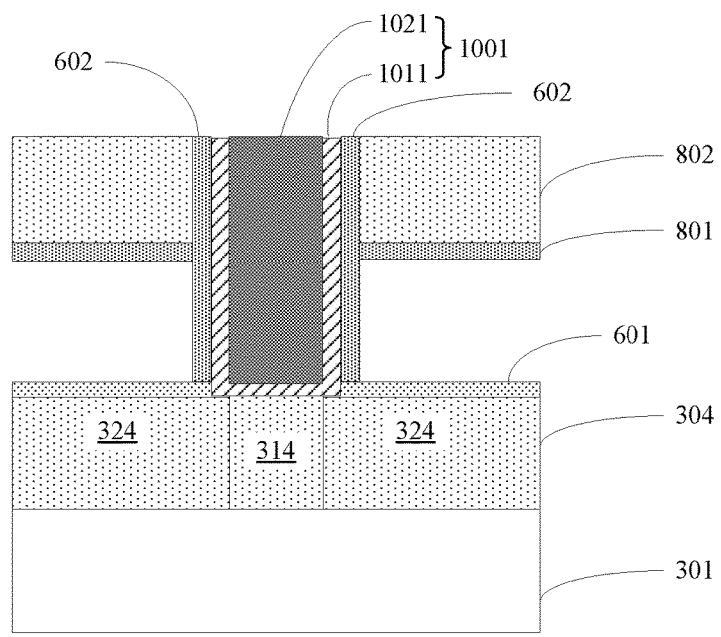
Figure 10B:
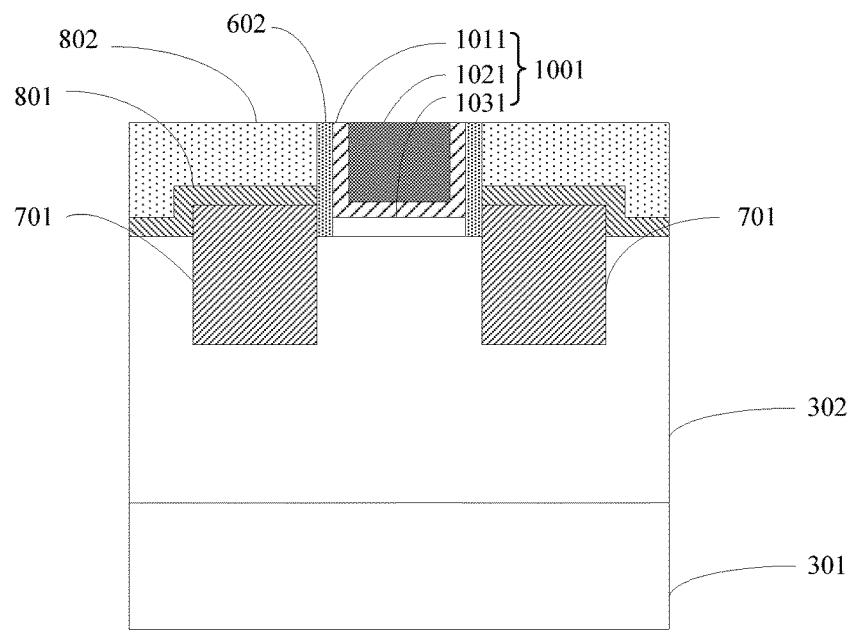
Figure 10C:
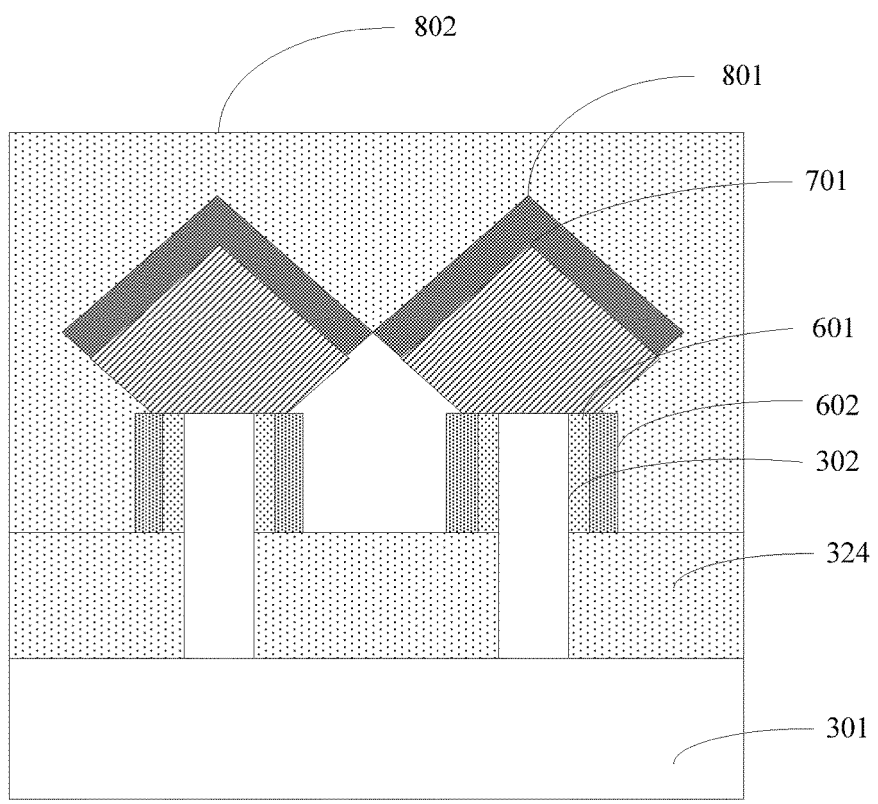

Subsequently, as shown in FIG. 10A, FIG. 10B, and FIG. 10C, a gate structure 1001 is formed in the groove 901. In one implementation, the gate structure 1001 may include a gate dielectric layer 1011 at a bottom portion of the groove 901 and a gate 1021 on the gate dielectric layer 1011. In addition, the gate dielectric layer 1011 may also be formed at a side wall of the groove 901. In one implementation, the gate dielectric layer 1011 may be a high-K dielectric layer, and the gate 1021 may be a metal gate. Preferably, the gate structure 1001 may further include an interfacial layer 1031 at the bottom portion of the groove 901, and the gate dielectric layer 1011 is formed on the interfacial layer 1031. It should be understood that the interfacial layer 1031 herein may be formed using thermal oxidation. Therefore, the interfacial layer 1031 is merely shown at the surface of the semiconductor fin 302.

This disclosure further provides a semiconductor device that may be manufactured by using, but not limited to, the manufacturing method provided above.

In one implementation, as shown in FIG. 10A, FIG. 10B, and FIG. 10C, the semiconductor device may include a substrate 301; a semiconductor fin 302 on the substrate 301; and an isolation region 304 at sides of the semiconductor fin 302, where an upper surface of the isolation region 304 is lower than an upper surface of the semiconductor fin 302.

The semiconductor device may further include a gate structure 1001. The gate structure 1001 covers a portion of the semiconductor fin 302 and a portion of the isolation region 304. Herein, the portion of the isolation region 304 that is covered by the gate structure 1001 is referred to as a first region 314, a portion of the isolation region 304 that is located at at least one of two sides of the gate structure 1001 is referred to as a second region 324, and an upper surface of the first region 314 is approximately leveled with that of an upper surface of the second region 324. In one implementation, the gate structure 1001 may include a gate dielectric layer 1011 and a gate 1021 on the gate dielectric layer 1011. The gate dielectric layer 1011 is on a portion of the semiconductor fin 302 and on the isolation region 304.

The semiconductor device may further include a first spacer layer 602. The first spacer layer 602 is located at a side wall of the gate structure 1001 and at a side wall of a portion of the first region 314 that is above the second region 324. Preferably, the material for the first spacer layer 602 includes a nitride of silicon. Preferably, the thickness of the first spacer layer 602 is 2-5 nm.

In one implementation, the semiconductor device may further include active regions 701 that are at two sides of the gate structure 1001 and that are at least partially located in the semiconductor fin 302, for example, a source region and a drain region.

Heretofore, the semiconductor device and the manufacturing method therefor according to implementations of this disclosure are described in detail. To avoid obscuring the idea of this disclosure, some details generally known in the art are not described. According to the foregoing descriptions, a person of ordinary skill in the art may understand how to implement the technical solutions disclosed herein. In addition, the implementations described in this disclosure may be combined in any form. A person of ordinary skill in the art should understand that various modifications may be made to the implementations described above without departing from the scope and the spirit of this disclosure that are defined by the appended claims.

What is claimed is:

1. A method for manufacturing a semiconductor device, comprising:

providing a substrate structure, wherein the substrate structure comprises:
  a substrate;
  a semiconductor fin on the substrate;
  a dielectric layer on the semiconductor fin;
  an isolation region at sides of the semiconductor fin, wherein an upper surface of the isolation region is lower than an upper surface of the semiconductor fin, wherein the isolation region comprises a first region and a second region; and
  a pseudo gate covering a portion of the dielectric layer and the first region of the isolation region, wherein the second region of the isolation region is located on two sides of the pseudo gate;

removing a portion of the second region for a predetermined removal depth, so that an upper surface of the remaining second region is lower than an upper surface of the first region;

growing an epitaxial source and drain on the semiconductor fin on sides of the pseudo gate;

removing the pseudo gate and the dielectric layer below the pseudo gate to form a groove, wherein the predetermined removal depth is approximately equal to a sacrificially removed depth of the first region when removing the pseudo gate; and forming a gate structure in the groove.

2. The method according to claim 1, further comprising:
determining the predetermined removal depth based on computer simulation; or
adjusting the predetermined removal depth according to a process feedback.

3. The method according to claim 1, wherein the method further comprises:
before growing the epitaxial source and drain, forming a first spacer layer at a side wall of the pseudo gate and at a side wall of a portion of the first region above the remaining second region.

4. The method according to claim 3, wherein growing the epitaxial source and drain comprises:

removing, after the first spacer layer is formed, a portion of the semiconductor fin at two sides of the pseudo gate, so as to form recesses; and epitaxially growing a semiconductor material in the recesses, so as to form raised active regions.

5. The method according to claim 4, further comprising:

depositing an interlayer dielectric layer after the raised active regions are formed, wherein the interlayer dielectric layer is planarized to expose the pseudo gate.

6. The method according to claim 1, wherein the gate structure comprises:

a gate dielectric layer at a bottom portion of the groove; and a gate on the gate dielectric layer.

7. The method according to claim 6, wherein the substrate structure further comprises a hard mask layer on the pseudo gate.

* * * * *